United States Patent [19]

Shimbo

[11] 4,380,481
[45] Apr. 19, 1983

[54] METHOD FOR FABRICATING SEMICONDUCTOR DEVICES

[75] Inventor: Masafumi Shimbo, Tokyo, Japan

[73] Assignee: Kabushiki Kaisha Daini Seikosha, Japan

[21] Appl. No.: 244,793

[22] Filed: Mar. 17, 1981

[30] Foreign Application Priority Data

Mar. 27, 1980 [JP] Japan .................................. 55/39463

[51] Int. Cl.³ .......................................... H01L 21/273
[52] U.S. Cl. ..................................... 148/187; 29/571; 29/574
[58] Field of Search .................. 29/574, 571; 148/187; 156/626

[56] References Cited

U.S. PATENT DOCUMENTS

| | | | |
|---|---|---|---|
| Re. 30,251 | 4/1980 | Kooi | 29/571 |
| 3,730,778 | 5/1973 | Shannon et al. | 148/187 X |
| 3,940,288 | 2/1976 | Takagi et al. | 148/1.5 |
| 4,026,740 | 5/1977 | Owen | 148/187 X |
| 4,114,255 | 9/1978 | Salsbury et al. | 29/571 |
| 4,233,091 | 11/1980 | Kawabe | 29/574 X |

Primary Examiner—G. Ozaki
Attorney, Agent, or Firm—Robert E. Burns; Emmanuel J. Lobato; Bruce L. Adams

[57] ABSTRACT

A method of fabricating a semiconductor device comprising forming an island-shaped multi-layered structure of oxides and nitrides on the surface of a semiconductor. The multi-layered structure is selectively etched to define diffusion windows for forming a semiconductor structure in the semiconductor surface having a central region of one conductivity type surrounded by another region of a different conductivity type. A second island-like multi-layered structure is formed and is etched for controlling the duration of the etching steps by controlling the amount that the masks lift off from the insulation layers subjected to etching. The etching is carried out by side etching.

7 Claims, 36 Drawing Figures

METHOD FOR FABRICATING SEMICONDUCTOR DEVICES

BACKGROUND OF THE INVENTION

The present invention relates to a method for fabricating a semiconductor, especially a vertical type static induction transistor(SIT) or FET having a structure provided with a first region of high impurity density(e.g., gate region) encircling a second region of high impurity density(e.g., source or drain region).

To explain the problems or limitations of the conventional fabricating method, a SIT in a SITL having a lateral bipolar transistor as load is illustrated as an example of the above-mentioned semiconductor device in FIG. 1.

FIG. 1(a) is a plane view of a SITL of the so-called planar-gate type. Upward type SIT and oxide films are omitted therefrom to simplify the figure. FIG. 1(b) is a sectional view taken on the line A—A' in FIG. 1(a). A lateral p n p bipolar transistor for a load is composed of p+ emitter(injector) region 15, n− base(epitaxial) region 13 and p+ collector(gate) region 14. An upward type SIT is composed of the P+ gate region 14, which corresponds to the first region encircling n+ drain region 11 which corresponds to the second region, n− channel-(epitaxial) region 13 and n+ source region 12 between substrates. A drain electrode 1 is connected to the n+ drain region 11 through a window 111 for drain contact and a gate electrode 4 is connected to p+ gate region 14 through a window 114 for gate contact. An injector electrode 5 is connected to a p+ injector region 15 through a window 115 for injector contact, and n+ source region 12 is normally grounded.

Such a structure will be normally fabricated by the following method. At first, an n− epitaxial growth layer 13 is formed on the substrate including also n+ source region 12 or buried layer, and then, the p+ injector region 15 and the p+ gate region 14 are formed by oxidation, photo-lithography and selective diffusion. For high speed operation and lower power consumption, a small area of p+ gate region 14 and a window for diffusion with small line width(first window) are usually required. However, it is difficult to obtain good reproducibility by today's photo-lithography technique when the width is less than a few μm, and more typically, less than about 2 μm. The window with a width of less than 1 μm can be obtained by an electron beam exposure, however, it is not suitable for mass production. Next, although a window for forming n+ drain region 11(a second window) is defined so as to be encircled by the p+ gate region 14, in order to reduce the capacitance between the gate-drain, the formation of a small window and high accuracy in positioning are required. These requirements become more severe as the width of n+ channel region 13(gate space) inside of p+ gate region 14 becomes narrow. The gate space depends upon the impurity density of n+ channel region 13 and the requirement for SIT characteristics and the value is normally selected to be less than 10 μm. Particularly, to reduce the value of leakage current when the gate voltage is zero, severe fabrication accuracy will be required since the gate space is normally selected to be less than 5 μm. Next, the windows for electrodes 111, 114 and 115 are defined and metal evaporation, such as Al, and photo-lithography are carried out to obtain a complete device.

As described above, when precise fabrication is required for a SIT for increasing the performance of an IC and integration density, the requirements for accuracy of line width or positioning at the fabrication of the gate region window and the drain region window become more severe for the photo-lithography technique. The accuracy limitation for today's technology will be about 2 μm in line width and range between 0.5 and 1 μm in positioning. The limitation of the performance depends upon these accuracy limitations. There is a similar problem to that of SITL in a vertical-type SIT, a vertical-type FET, high impurity density region (graft base) for emitter(or collector) and base electrodes of a bipolar transistor and a short channel MOS transistor.

The present invention is intended to remove these problems in the conventional manufacturing method and to provide a method for fabricating semiconductor devices mentioned above, wherein precise fabrication and high accuracy positioning can be realized even by today's photo-lithography technique without increasing the number of masking steps.

An object of the present invention is to provide a fabricating method in which multi-insulation layered structure composed of oxide film and nitride film is employed and side etching for these insulation films is actively utilized.

Another object of the present invention is to provide a method for effectively controlling the amount removed by side etching.

DETAILED DESCRIPTION OF THE INVENTION

The present invention will be described in more detail for the case of one SIT, in conjunction with the attached drawings.

FIGS. 2(a) to 2(g) are sectional views illustrating the steps of fabricating an inverted type SIT in accordance with the present invention. To simplify, the n+ source region 12 is omitted from these figures. A test pattern forming on another portion apart from the SIT is illustrated in FIGS. 3(a) to 3(e) and the explanation will be made at the same time.

Figure 2A:
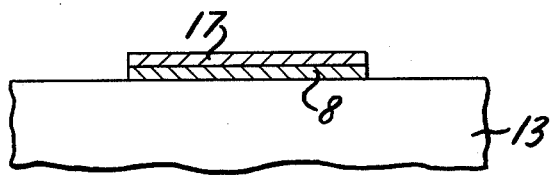
FIGS. 2(a) to 2(g) are cross-sectional views illustrating each step of the fabrication method for an inverted type SIT in accordance with the present invention.

FIG. 2(a) is a sectional view illustrating an insulation layer of double layer structure which is formed on the n⁻ epitaxial layer 13 so as to correspond to the region for forming the SIT in future steps. The insulation layer is composed of a nitride film(Si$_3$N$_4$ film) 8 and an oxide film (SiO$_2$ film) 17 in the order from the lower layer. It is effective to form the thin oxide film under the nitride film 8 for compensating distortion. As described hereinafter, an island with predetermined width similar to the above mentioned multi-insulation layer(e.g., multi-insulation layer composed of nitride film 108, oxide film 107, nitride film 118 and oxide film 117) is formed on the same chip or wafer. A 500 to 1000 Å thickness is proper for the nitride film 8, CVD, thermal oxidation film of polycrystal or thermal oxidation film of a nitride film are usable for the oxide film 17, and 1000 Å to 1 μm thickness is selected.

Figure 2B:
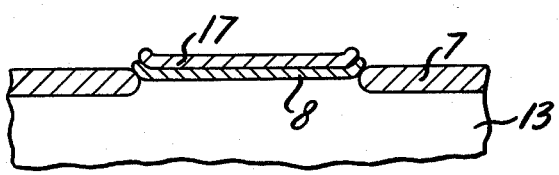
Figure 3A:
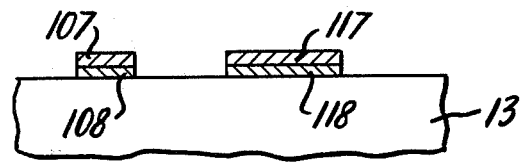
FIGS. 3(a) to 3(e) are cross-sectional views of test patterns in accordance with the present invention, the sectional views are illustrated along the steps of FIGS. 2(a) to 2(e)
Figure 3B:
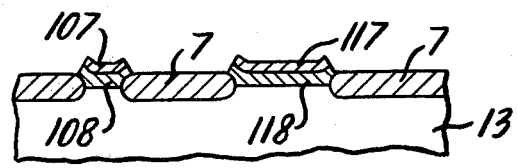

FIG. 2(b) and FIG. 3(b) illustrate sectional views wherein a selective oxidation film 7 is formed by using the nitride films 8, 108 and 118 as masks. Normal thermal oxidation and high pressure oxidation are applicable and it is desired that the thickness of selective oxidation film 7 is thicker than that of the oxidation films 17, 107 and 117. However, as described hereinafter, the thickness sufficient for a nitride film etching mask and impurity diffusion mask is desired. For leveling the surfaces of the selective oxidation film 7 and the n⁻ epitaxial layer 13, or for forming a concave portion in accordance with the structure of the SIT, it is useful to form the selective oxidation film 7 after cutting one portion of n⁻ epitaxial layer 13.

Figure 2C:
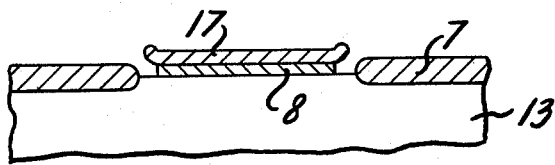
Figure 3C:
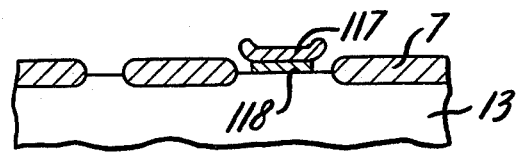

FIG. 2(c) is a sectional view illustrating that over etching is carried out for a long time in the atmosphere of hot phosphoric acid, for example, after a thin thermal oxidation film of 1000 Å produced on the side face of the nitride film 8 is removed by SiO$_2$ etching for a short time, and the nitride film 8 under the oxide film 17 is subjected to side etching to define a window for forming p⁺ gate region 14. At the same time, as shown in FIG. 3(c), when the width of the double insulation layer of nitride film 108 and oxide film 107, which is used as a test pattern, is determined at less than two times the determined amount removed by side etching, the nitride film 108 is removed in this step so that the oxide film 107 is lifted off. On the other hand, if the width of the double insulation layer (107, 108) is selected to be two times the amount removed by side etching, or if a plurality of such an island-like double insulation layer which are different in width are formed, the amount removed by side etching can be exactly monitored on the basis of the test pattern. The speed of side etching for the nitride film 8 will range between 1 and 1.5 μm/hr in the atmosphere of hot phosphoric acid at 170° C. Although Si is also somewhat subjected to etching, this effect will be small under the lower temperature. The side etching can be made not only by the hot phosphoric acid, but also by isotropic plasma etching using a compound including fluorine, however, a large difference in etching speed among the nitride film, the oxide film and Si is required.

Figure 2D:
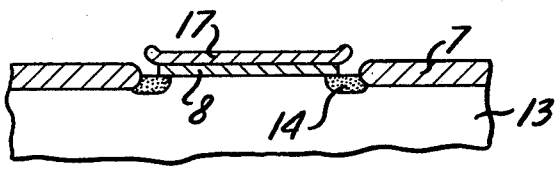
Figure 2E:
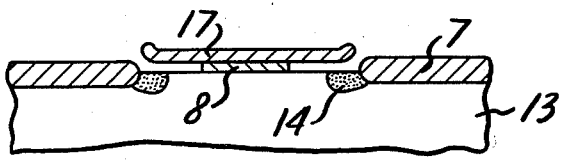
Figure 3D:
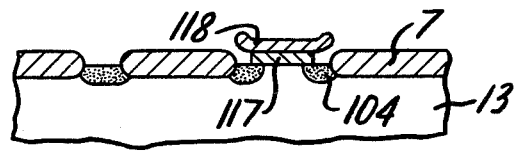
Figure 3E:
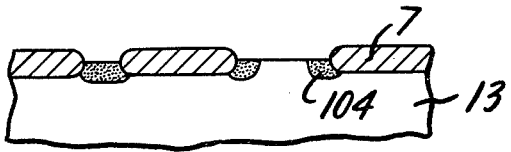

FIG. 2(d) is a sectional view wherein a pre-deposition diffusion of p type impurity is made through a first window for forming the p⁺ gate region 14, which window is located between the nitride film 8 and selective oxidation film 7, and narrow p⁺ gate region 14 is formed. For a SITL, a p⁺ injector region is formed at the same time of the diffusion, and the window is defined by photo-lithography technique at the same time as the side etching step shown in FIG. 2(c). As illustrated in FIG. 3(d), a p⁺ region 104 is formed on the test pattern in this step. Next, as well as in the case of FIG. 2(c), the nitride film 8 is subjected to side etching by using the oxide film 17 as a mask to decrease the film width to such a degree of the width of the drain window(FIG. 2(e)). The amount removed by side etching can be monitored by the lift-off of the test pattern as shown in FIG. 3(e).

Figure 2F:
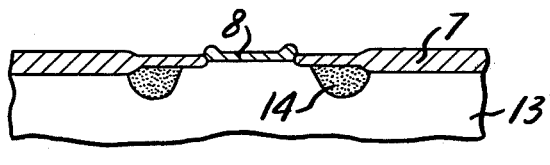
Figure 2G:
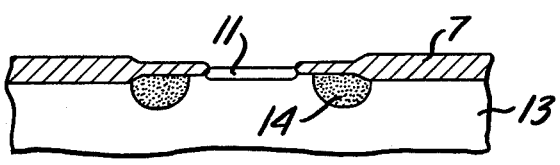

FIG. 2(f) is a sectional view in which p⁺ gate region 14 is subjected to selective oxidation by using the nitride film 8 as a mask in the condition that the oxide film 17 is removed or remains, as the size of the region is adjusted so as to be equal to a predetermined size. FIG. 2(g) is a sectional view in which the nitride film 8 is removed and the n⁺ drain region 11 is formed. For wiring which is made after the diffusion of the n⁺ drain region 11, especially, a wash drain system is advantageous for precise fabrication, and it is effective to provide electrodes of polycrystal silicon.

As described above, due to side etching control, the first window for forming the p⁺ gate region 14, which has a width of less than 1 μm, can be easily realized. For example, when the width of the test pattern is selected to be 2 μm, the control condition can be confirmed on the basis of the lift-off. Even if the lift-off does not occur, it is also possible to confirm by measuring the width of the remaining nitride film 108. Since the second window for forming the n⁺ drain region 11 can be defined by isotropic side etching, the side etching can be carried out with the gate space as the center. As a result, capacitance can be sufficiently reduced and the conventional fine and precise photo-lithography is not required.

Figure 4A:
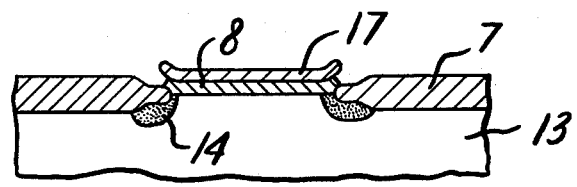
FIGS. 4(a) to 4(c) are cross-sectional views for explaining the modified steps of the fabrication method of the present invention shown in FIG. 2.
Figure 4B:
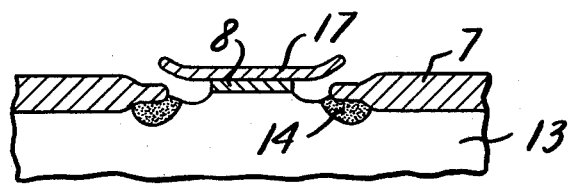
Figure 4C:
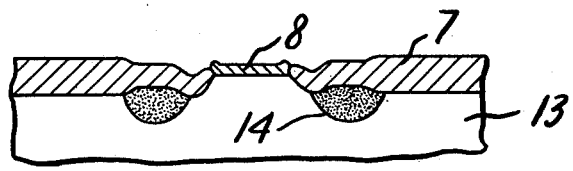

FIG. 4 illustrates a sectional view in which one part of the fabricating steps illustrated in FIG. 2 are changed. FIG. 4(a) illustrates the step, in which an oxide film is formed on the gate region 14 in the step of FIG. 2(d) as the diffusion of p type impurity is carried out in the atmosphere of oxidation. Especially, since the high impurity density region 14 is extremely subject to attack by etching of nitride film by hot phosphoric acid at about more than 170° C., this oxide film is of use in the later side etching step. FIG. 4(b) is a sectional view showing the condition after the second side etching of the nitride film 8 for defining the window for the n⁺ drain region 11. In this step, one portion of n⁻ epitaxial layer 13 is etched by phosphoric acid heated at more than 170° C. The amount of Si removed by etching is about one tenth of the amount of nitride film removed by side etching. FIG. 4(c) is a sectional view illustrating the selective oxidation after the removal of the oxide film 17. Due to a concave portion formed by phosphoric acid etching of Si, the distance between the n⁺ drain region 11 and the p⁺ gate region 14 becomes long to reduce capacitance and to remove the characteristic of the resisting voltage. These effects cannot be obtained only by using phosphoric acid, but also by using plasma etching.

Figure 1A:
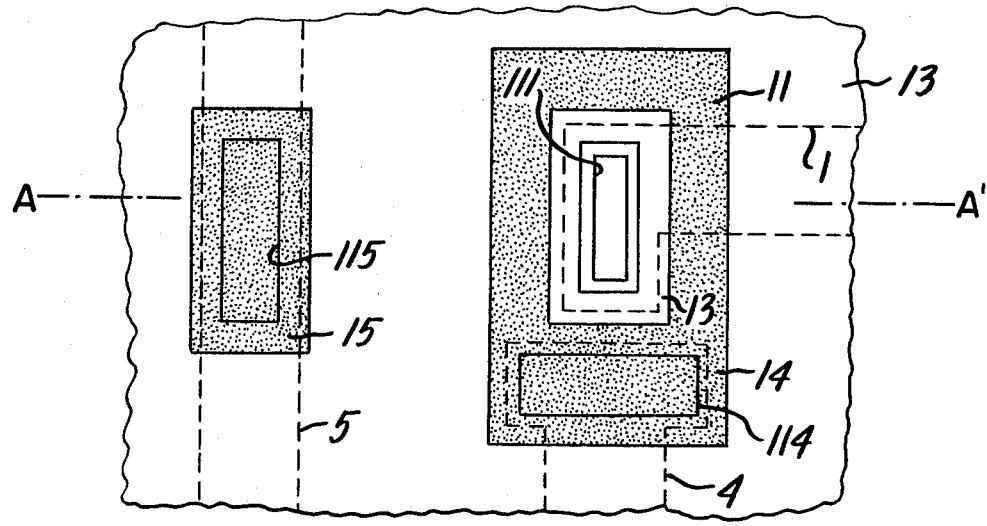
FIG. 1(a) is a plane view of the conventional planar-gate type SITL.
Figure 1B:
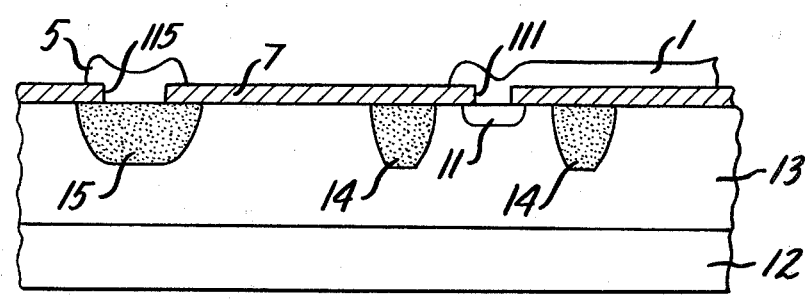
FIG. 1(b) is a cross-sectional view taken on the line A—A in FIG. 1(a)
Figure 5A:
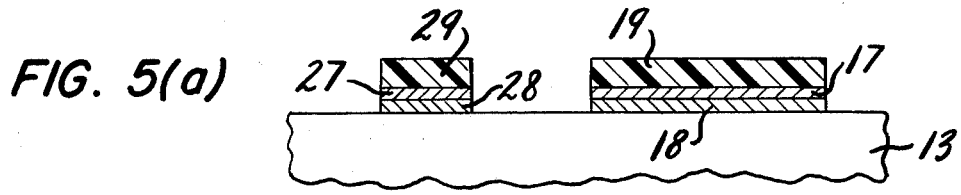
FIGS. 5(a) to 5(g) are cross-sectional views for explaining the steps of another method for fabricating a SITL in accordance with the present invention.
Figure 5B:
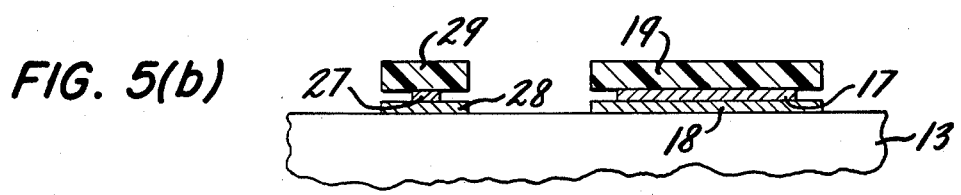
Figure 5C:
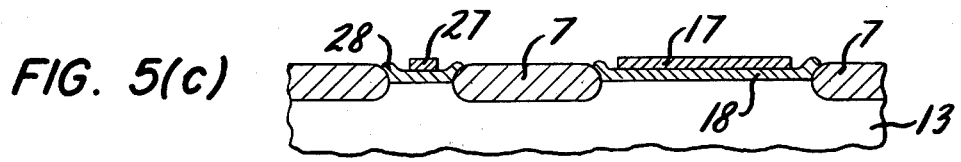
Figure 5D:
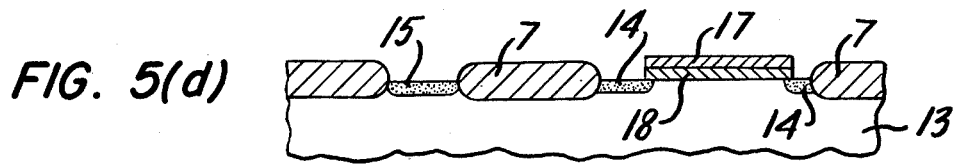
Figure 5E:
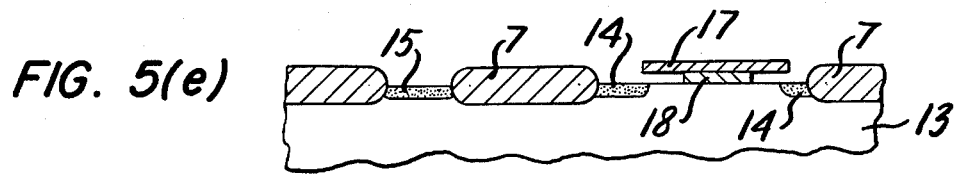
Figure 5F:
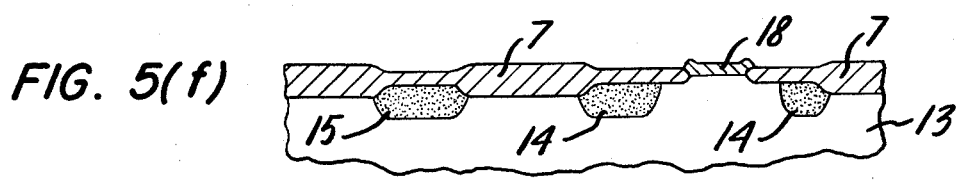
Figure 5G:
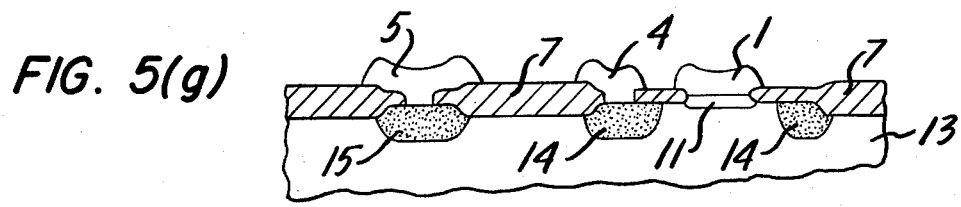

FIG. 5(a) to FIG. 5(g) are sectional views illustrating fabricating steps for a SITL similar to that of FIG. 1, which is accorded with another fabricating method of the present invention. FIG. 5(a) is a sectional view illustrating the step of forming a double layer structure of insulation layer composed of oxide films 17, 27 and nitride films 18, 28 by using resists 19 and 29 as masks on the portion at which the SIT and p⁺ injector region 15 are formed in later steps. This step can be processed by plasma etching at low temperature and it is preferable to process without side etching. FIG. 5(b) is a sectional view in which the oxide films 17 and 27 are subjected to side etching by normal etching for oxide film, which uses a HF system mixture. The resists are usable for masks in this step. After this, the resists are removed, and the first selective oxidation film 7 is formed by using nitride films 18 and 28 (FIG. 5(c)). The nitride film 18 is etched by using the oxide film 17 as a mask to obtain the first window for forming p+ gate region 14, and the p+ gate region 14 is formed (FIG. 5(d)). At this time, the oxide film 27 on the p+ injector region 15 and one portion of the oxide film 17 on the space for forming the contact portion of p+ gate region 14, are removed by photo-lithography before etching of nitride films 18 and 28. Therefore, the injector region 15 and the p+ gate region 14 can be formed so as to be sufficiently large in area. Also, as well as in the case illustrated in FIG. 3, the photo-lithography step will be omitted when the width of the window for forming the p+ injector region 15 is selected to be equal to or less than two times amount of side etching of the monitor test pattern removed by side etching. This matter is also applicable to the contact portion of p+ gate region 14. And then, as well as in the former example, the nitride film 18 is subjected to side etching (FIG. 5(e)), and to selective oxidation (FIG. 5(f)). Then, contact windows for p+ gate region 14 and p+ injector region 15 are defined after the formation of n+ drain region 11 and metal wirings are made to obtain a complete device (FIG. 5(g)). This sequence of steps has advantages of the reduction of masking steps, four masking steps the same as that of the conventional method or three masking steps, and easy precise fabrication. Of course, although the same steps as that of FIG. 3 or FIG. 5 can be used, the description thereof will be omitted.

Figure 6A:
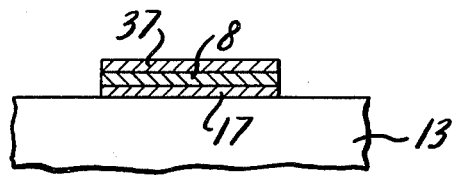
FIGS. 6(a) to 6(g) are cross-sectional views for explaining the steps of still another method for fabricating a vertical type SIT.
Figure 6B:
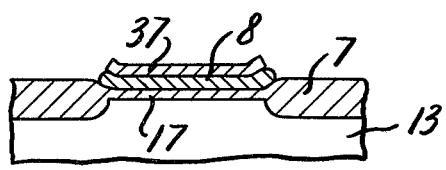
Figure 6C:
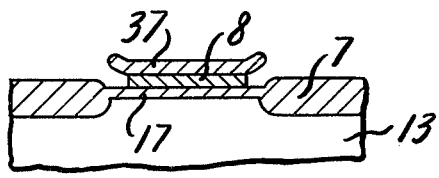
Figure 6D:
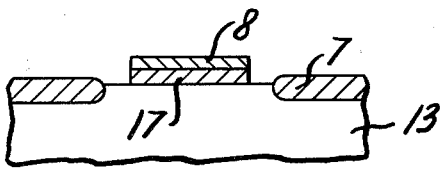
Figure 6E:
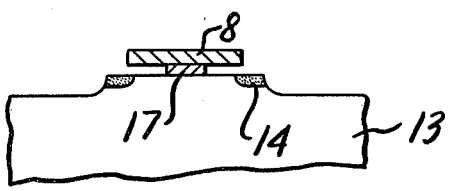
Figure 6F:
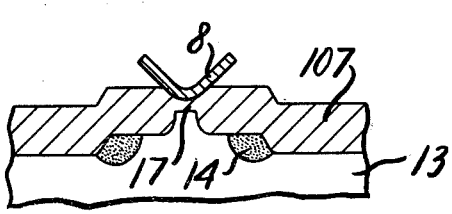
Figure 6G:
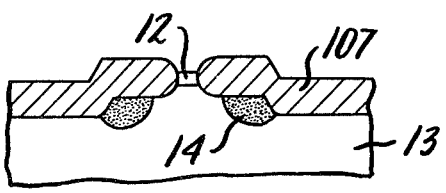
Figure 7A:
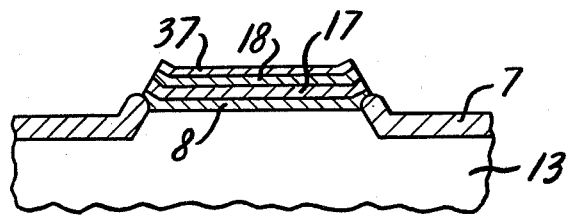
FIGS. 7(a) to 7(e) are cross-sectional views for explaining the steps of another method for fabricating inverted type SIT in accordance with the present invention.
Figure 7B:
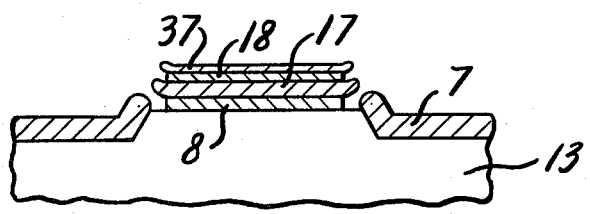
Figure 7C:
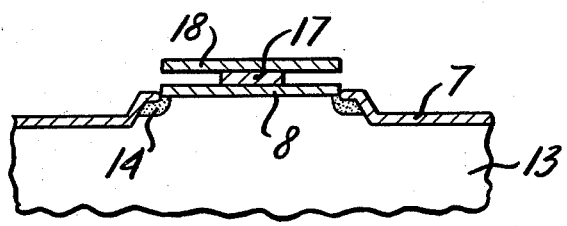
Figure 7D:
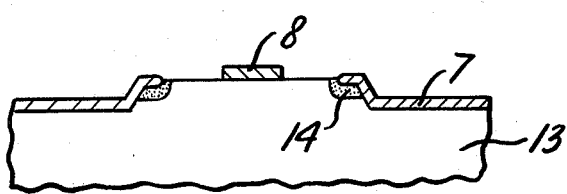
Figure 7E:
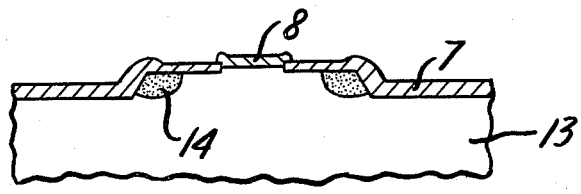

Another sequence of fabricating steps of the present invention for the example of a vertical type SIT will be described in conjunction with FIG. 6. In this embodiment, a multi-insulation layer with three layers is used and the multi-insulation layer is composed of a first oxide film 17, a nitride film 8 and a second oxide film 37 in the named order from the lower layer. FIG. 6(a) is a sectional view in which the insulation layer mentioned above is formed in the form of an island on the portion at which the SIT will be formed in later steps. The suitable thickness for the first oxide film 17 ranges between 500 and 2000 Å. Some difficulty for side etching in later steps will occur and extremely less effect for compensating distortion will be obtained when the film is too thin, and it is difficult to define windows when the film is too thick. Therefore, $SiO_2$ formed by CVD method is preferable in relatively high etching speed applications. However, the invention is not limited to the CVD method. A thickness sufficient to use as a mask in the step of side etching for nitride film 8 is required for the second oxide film 37, and the thickness ranges from 500 Å to 1 μm since it can be easily removed in a later step. The first selective oxidation film 7 is formed in the step of FIG. 6(b), the nitride film 8 is subjected to side etching by using the second oxide film 37 as a mask in the step of FIG. 6(c), and the window for forming p+ gate region 14 is defined by the nitride film 8 mask. In the step of FIG. 6(e), after p+ gate region 14 is formed by selective diffusion, the first oxide film 17 is subjected to side etching by using the nitride film 8 as a mask. The oxide films on other surfaces will become thin or be substantially removed. In the step of FIG. 6(f), a selective oxidation film 107 is formed again with enlarging of the p+ gate region 14 by diffusion. In the step of FIG. 6(g), the nitride film 8 and the first oxide film 17 are removed, and a n+ source region 12 is formed. In this step, the confirmation of side etching is also possible by the test pattern and it is advantageous that Si is scarcely etched at the time of side etching for the nitride film 8. However, the oxide film tends to be thin as the diffusion is not so deep. Therefore, it is preferable to form the selective oxidation film 107 in high pressure oxidation at low temperature.

In FIG. 7, sectional views showing another sequence of steps of the present invention are illustrated, and an inverted type SIT is illustrated as an example. FIG. 7(a) is a sectional view illustrating the steps of forming an island-like four-layer insulation layer composed of the first nitride film 8, the first oxide film 17, the second nitride film 18 and the second oxide film 37 in the named order from the lower layer and forming a first selective oxidation film 7 after the formation of a concave portion. FIG. 7(b) is a sectional view illustrating the steps in which the first and the second nitride films 8 and 18 are subjected to side etching by using the first and the second oxide films 17 and 37 as masks, and the first window for gate diffusion is defined between the end portions of the first nitride film 8 and the first selective oxidation film 7. FIG. 7(c) is a sectional view illustrating the steps in which the p+ gate region 14 is formed and an oxide film is formed thereon by oxidation with impurity diffusion, and the first oxide film 17 is subjected to side etching by using the second nitride film 18 as mask. At this time, the second oxide film 37 is removed. FIG. 7(d) is a sectional view illustrating the steps in which the second nitride film 18 is completely removed by etching the nitride film and the first nitride film 8 is left on the future n+ drain region 11. FIG. 7(e) is a sectional view illustrating the steps in which p+ gate region 14 is subjected to selective oxidation with diffusion. The steps after this are the same as that of the foregoing example.

As described above, since the present invention utilized the side etching for nitride film and oxide film, the width of a window can be controlled only by etching and the resulting width can be confirmed by the test pattern. Therefore, the first window for forming the gate is narrow and the window for forming the drain (or source) can be located on the low impurity density layer (epitaxial layer) within the central portion of the gate region. Moreover, it is possible to define the window for forming the gate with a small size. It is also an advantage to use a self alignment technique. The number of masking steps is four or three and it is equal to or less than that of the conventional method. Yield will be increased since the present invention is realized without photo-lithography or use of a fine pattern. The examples of the fabrication method of the present invention have been described for the n channel SIT, however, the present invention is also applicable to the p channel SIT, the FET having the same structure as that of SIT and the graft base transistor. The present invention is applicable to all of the semiconductor devices having a second region of high impurity density encircled by a first region of high impurity density, and the present invention is effective for the field effect thyristor, another IC, lateral bipolar transistor (especially, punch-through type with narrow base width), MOS FET and IC including MOS FET. Although a multi-insulation layer composed of oxide film and nitride film is described in the foregoing examples, it is also possible to use oxide film containing a high impurity, such as PSG or BSG, which are easy to etch (especially, when the lowest layer is a nitride film), nitride film containing a high impurity, thin film of aluminum oxide and thin film of spinel. Since the application field of the present invention is extremely wide and its effect is extremely remarkable, the industrial value of the invention is great.

I claim:

1. A method for fabricating a semiconductor device, comprising the steps of:
    forming a multi-insulation layer composed of at least two kinds of materials including an anti-oxidation substance and an oxide on a semiconductor surface region of low impurity density in the form of an island;
    forming a first selective oxidation film on the surface of said low impurity density region by using at least one layer of said multi-insulation layer as a mask;
    defining a first window with a width determined by at least one side face of said multi-layer which has been subjected to side etching and an end portion of said first selective oxidation film and forming a first region of high impurity density in said semiconductor surface along the periphery of said island-like multi-insulation layer by selectively diffusing an impurity;
    forming the anti-oxidation insulation layer of said multi-insulation layer so as to reduce the size thereof after an insulation layer which is not a most upper layer and which is at least one layer of said multi-insulation layer is subjected to a second side etching and carrying out selective oxidation; and
    forming a second region of high impurity density in the inside of said first region after removing said multi-insulation layer and defining a window.

2. A method for fabricating a semiconductor device as claimed in claim 1 wherein said multi-insulation layer has a double layer structure of a nitride film and an oxide film thereon and the first time and the second time side etching operations are carried out for etching the nitride film by using the oxide film as a mask member.

3. A method for fabricating a semiconductor device as claimed in claim 1 wherein said multi-insulation layer has a double layer structure of a nitride film and an oxide film thereon, a first selective oxidation film is formed after the first time side etching for said oxide film is carried out by utilizing the mask member used in the step of forming the island-like multi-insulation layer, said nitride film is removed by using a mask of said oxide film to define said first window, and the second time side etching is carried out for said nitride film by using said oxide film as a mask.

4. A method for fabricating a semiconductor device as claimed in claim 1, 2 or 3 wherein after the surface of said first region is subjected to an oxidation, the second time side etching is carried out after or during impurity selective diffusion for the formation of said first region.

5. A method for fabricating a semiconductor device as claimed in claim 1 wherein said multi-insulation layer has at least four layers composed of a first nitride film, a first oxide film, a second nitride film and a second oxide film in the order from the lowest layer, the first time side etching is carried out for the first and the second nitride films by using the first and the second oxide films as masks, and the second side etching is carried out for the first oxide film by using the second nitride film as a mask.

6. A method for fabricating a semiconductor device as claimed in claim 1 wherein said multi-insulation layer has at least three layers composed of a first oxide film, a nitride film and a second oxide film in the named order from said semiconductor surface, the first side etching is carried out for the nitride film by using the second oxide film as a mask, said first window is defined by removing one portion of said first oxide film by using the nitride film as a mask, and the second side etching is carried out for the first oxide film by using the nitride film as a mask.

7. A method for fabricating a semiconductor device as claimed in claim 1, 2, 3, 5 or 6 wherein another island-like multi-insulation layer with a predetermined width is prepared besides said island-like multi-insulation layer, and each amount of the first side etching and the second side etching is controlled by the lift-off of the mask on the insulation layer subjected to the side etching.

* * * * *